(12) United States Patent
Busch et al.

(10) Patent No.: US 6,201,750 B1
(45) Date of Patent: Mar. 13, 2001

(54) SCANNABLE FUSE LATCHES

(75) Inventors: Robert E. Busch; Fred J. Towler, both of Essex Junction; Reid A. Wistort, Westford, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/598,427

(22) Filed: Jun. 21, 2000

(51) Int. Cl.[7] .................................................... G11C 7/00
(52) U.S. Cl. ................................. 365/225.7; 365/189.05
(58) Field of Search ................................ 365/225.7, 200, 365/201, 189.05

(56) References Cited

U.S. PATENT DOCUMENTS

| | | | |
|---|---|---|---|
| 5,313,424 | 5/1994 | Adams et al. | 365/200 |
| 5,654,649 | 8/1997 | Chua | 326/38 |
| 5,764,878 | 6/1998 | Kablanian et al. | 395/182.05 |
| 5,789,970 | * 8/1998 | Denham | 371/22.2 |
| 5,914,906 | 6/1999 | Iadanza et al. | 365/230.03 |
| 6,125,069 | * 9/2000 | Aoki | 365/225.7 |

* cited by examiner

*Primary Examiner*—Vu A. Le
(74) *Attorney, Agent, or Firm*—Schmeiser, Olson & Watt; Steven Capella (57) ABSTRACT

Scannable fuse latches are provided that can override current fuse values, read current fuse values, and latch current fuse values. Using the scannable fuse latches of the current invention allows current fuse values to be overridden, which can be important in testing and failure analysis to place the integrated circuit in a known state. The scannable fuse latches of the current invention also allow current fuse values to be read. This aids failure analysis because the current state of the failed integrated circuit can be determined. Finally, the scannable fuse latches of the present invention allow the current state of fuses to be latched and provided to a core of an integrated circuit.

19 Claims, 6 Drawing Sheets

| Scan Out | Fuse Logic | | | |
|---|---|---|---|---|
| | FCLK | Fuse | Set | Clr |
| SI/SCLK | 0 | Intact | 0 | 0 |
| SI/SCLK | 0 | Blown | 0 | 0 |
| 0 | 1 | Intact | 0 | 1 |
| 1 | 1 | Blown | 1 | 0 |

SCANNABLE FUSE LATCHES

BACKGROUND OF THE INVENTION

1. Technical Field

This invention generally relates to integrated circuits on semiconductors, and more specifically relates to scannable fuse latches on these circuits.

2. Background Art

An on-chip fuse on an integrated circuit is a device that can be permanently set. When the fuse is initially created, it is essentially a "short", meaning that there is very little or no electrical resistance from one end to the other of the fuse. The fuse may be left this value, which is a logic zero. Alternatively, the fuse may be "blown" to become a logic one. In this state, there is a very high or infinite resistance from one end to the other of the fuse. Generally, a destructive process is used to blow the fuse.

On-chip fuses are used for various reasons. One reason is to provide an identity, which can provide the manufacturer valuable information about when and where the semiconductor chip was made. Another reason is to provide configuration bits, which permanently configure the chip. A final exemplary reason is to provide "remapping" of Random Access Memory (RAM) cells. When a RAM semiconductor chip is made, more RAM cells than needed are actually made on the chip. When bad RAM cells are found through testing, the good, extra RAM cells are "remapped" so that they are used instead of the bad RAM cells. The chip is retested and this process continues until the RAM chip completes an error-free test.

While fuses provide definite benefits to integrated circuit manufacturers, designers, and failure engineers, there are problems with the current fuses and their accessing mechanisms.

DISCLOSURE OF THE INVENTION

The preferred embodiments of the present invention provide scannable fuse latches that can override current fuse values, read current fuse values, and latch current fuse values. Using the scannable fuse latches of the current invention allows current fuse values to be overridden, which can be important in testing and failure analysis to place the integrated circuit in a known state. The scannable fuse latches of the current invention also allow current fuse values to be read. This aids failure analysis because the current state of the failed integrated circuit can be determined. Finally, the scannable fuse latches of the present invention allow the current state of fuses to be latched and provided to a core of an integrated circuit.

The foregoing and other features and advantages of the present invention will be apparent from the following more particular description of the preferred embodiment of the invention, as illustrated in the accompanying drawings.

BEST MODE(S) FOR CARRYING OUT THE INVENTION

As discussed above, the preferred embodiments of the present invention relate to integrated circuits having fuses or anti-fuses. A more complete discussion of the problems associated with fuses and their current systems follows in the Overview section. Individuals skilled in the art of fuses on integrated circuits may wish to proceed to the Detailed Description section of this specification. However, those individuals who are new to fuses should read this overview section in order to best understand the benefits and advantages of the present invention.

1. Overview

In prior art systems, fuses on integrated circuits are either readable, writable, or neither readable nor writable. Concerning the latter, redundancy fuse blocks are generally provided with no read or write capabilities. A redundancy fuse is a fuse used on a Random Access Memory (RAM) to remap good RAM cells into locations where bad cells are currently mapped. Currently, the only way to check the state of redundancy fuses is to physically observe each and every fuse.

Figure 5:
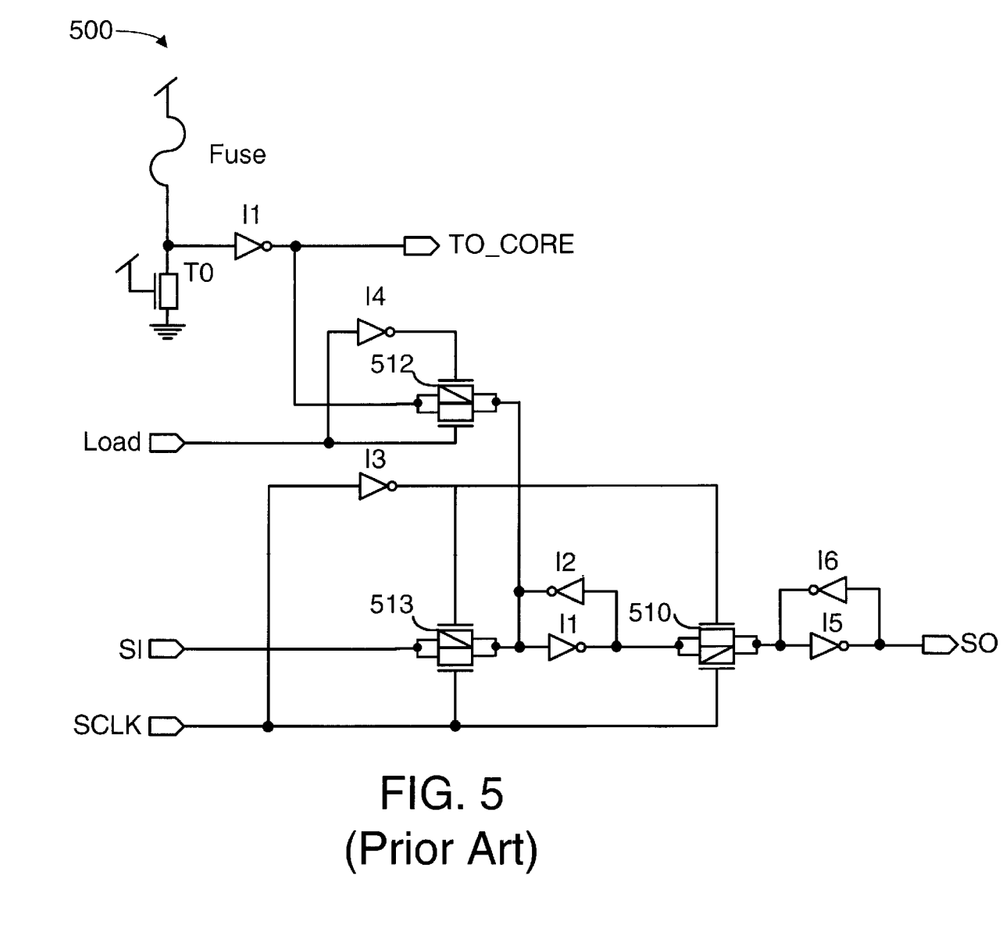
FIGS. 5 and 6 are prior art fuse systems that allow reading and writing, respectively, fuses.

Referring now to FIG. 5, a read-only prior art fuse system 500 is shown. This type of system would likely have been used on identification fuses, where it is beneficial to be able to read out the identification. This system 500 allows the fuse to be read but not written.

In FIG. 5, the state of the fuse is sent to the core through inverter I1. The "core" is any part of the integrated circuit that needs access to the fuse. If the fuse is blown, transistor T0 will ground the input to inverter I1. Inverter I1 will, thus, place a high voltage on the T0_CORE connection, which goes to the other logic (not shown) that uses the identification data. This fuse can be serially connected to other fuses through the scan-in input (SI) and the scan-out output (SO). This occurs by connecting the SO of one system to the SI of another system. When this system is read, the Load input is pulsed high while holding SCLK low. This latches the state of the fuse through pass driver 512. Pass driver 512 is in this example two transistors, a P-channel and an N-channel transistor. The pass driver 512 is either off or on. It turns on because the Load input goes high, thereby activating the N-channel transistor in pass driver 512 and the inverter 14. Inverter 14 activates the P-channel transistor in pass driver 512.

Holding the scan clock (SCLK) low deactivates pass driver 513 and activates pass driver 510 (both of these again comprise both P- and N-channel transistors to create a driver that is either on or off). The state of the fuse is available at the input to inverter I1. After passing through driver 512, the state of the fuse is latched by the inverters I1/I2 combination and propagates through pass driver 510 and is again latched in the inverters I5/I6 combination. The state of the fuse is thus available at scan-out SO.

Toggling the SCLK high de-activates pass driver 510, thereby holding the state of the latch formed by I5/I6. Pass driver 513 is activated and the latch formed by inverters I1/I2 is updated with the state of the scan-in input (SI), which is fed from the previous stage's SO output. Toggling the SCLK low de-activates pass driver 513, thereby holding the state of the latch formed by inverters I1/M2. Pass driver 510 is activated and the latch formed by inverters I5/I6 is updated with the state of the SI input that was previously latched in the inverters I1/I2 latch. Thus, the SO output becomes the state of the previous stage's SO output. Thus, by toggling Load once then SCLK a certain number of times (equivalent to the number of fuses that are serially connected), the state of the fuses may be read. Generally, the SO of the last fuse system 500 in a serial chain goes off-chip, as does the SI of the first fuse system 500 in the chain.

In the system of FIG. 5, there is no way to override the current value of the fuse. As more fuses are placed onto semiconductors, it becomes more important to be able to both read and write to fuses, and the system of FIG. 5 does not allow both read and write to occur. Additionally, in some integrated circuits, it is a requirement that the fuse be maintained with zero voltage across it. This system does not allow this to happen.

Figure 6:
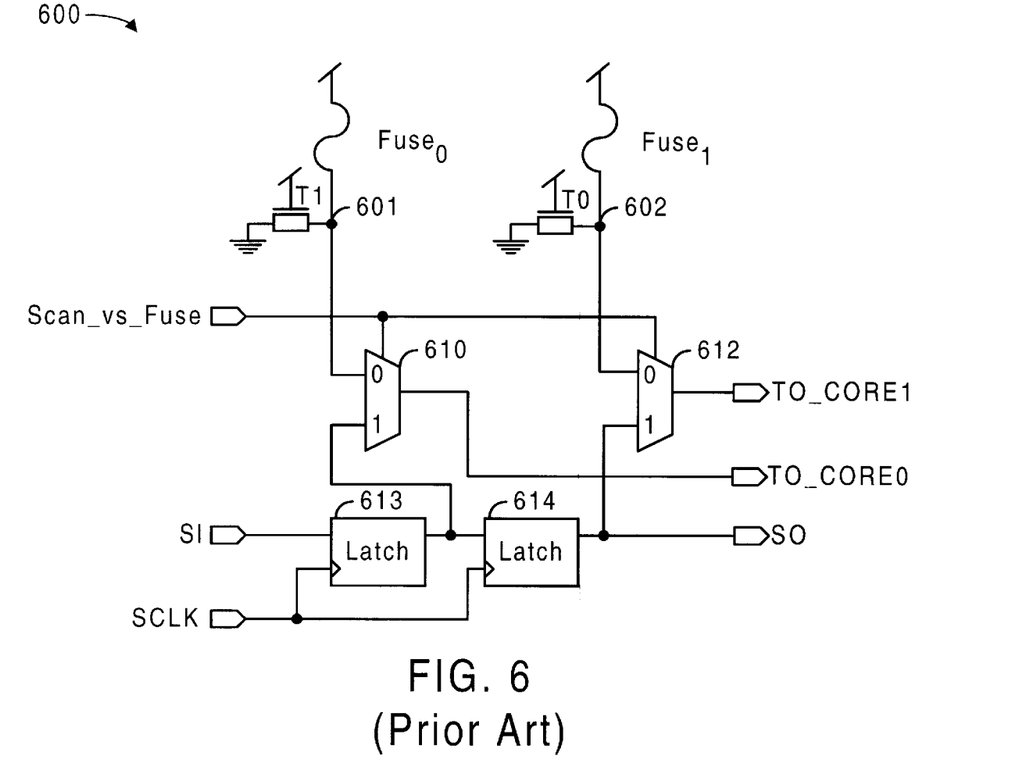

Referring now to FIG. 6, a prior art fuse system 600 is shown that allows fuses to be written. In this system, fuse zero is connected to transistor T1. If fuse zero is blown, node 601 will be grounded through transistor T1. On the other hand, if the fuse is not blown, location 601 will be pulled high. Fuse one is connected to transistor T0. If fuse one is blown, node 602 will be grounded through transistor T0. Alternatively, if the fuse is not blown, location 602 will be pulled high. Each of these nodes 601, 602 are inputs into multiplexors 610, 612, respectively. The Scan_vs_Fuse signal selects either the fuse (nodes 601, 602) as an output to the core (through signals TO_CORE0 and TO_CORE1), or the outputs of latches 613 and 614.

In this version, the scan-in input (SI) is used to override the values of the fuses. By serially connecting these systems 600, new values of fuses may be scanned in to replace the current value (blown or intact) of the fuses. This circuit does not allow fuse values to be read.

The problem with these circuits is that the fuses can be read out or overwritten, but not both. Additionally, there is no ability to retain low or no voltage on the fuse, which is a requirement of copper technologies, and yet still provide the state of the information to the core of the integrated circuit. Read/write capability for a fuse is important for failure analysis and testing. When integrated circuits had a few fuses, it was less of a problem to simply view the fuses and see what states the fuses were in. Currently, however, integrated circuits are being made with many fuses. In fact, it is becoming common to have five to six hundred fuses on an integrated circuit. Some large integrated circuits even have in the low thousands of fuses. It is simply too time consuming to view each of these fuses and determine its state. Moreover, once the integrated circuit is packaged, it is impractical to perform the steps necessary to access the fuses, as this entails destroying the packaging. Additionally, as the number of fuses on an integrated circuit increases, the number of fuse errors also increases. Without a way to read and write fuses, it will be increasingly harder to determine which fuses are the wrong values.

Concerning failure analysis, having the fuses be allowed to be both read and written is important. When an integrated circuit is returned from a customer with a failure, perhaps after years of being in the field, its important that a test engineer can place the integrated circuit in its original configuration. It is also important to be able to determine what the current state of the integrated circuit is. For instance, in Random Access Memories, (RAMs), a failure at a later date is sometimes caused by RAM cells that are close to RAM cells that were originally deemed bad. In this case, redundancy fuse blocks were previously used to remap the bad RAM bits into the extra good RAM bits. Redundancy fuse blocks are generally not given read or write capabilities. Without read and write capabilities, the redundancy fuse blocks must be manually observed to determine their states.

As previously discussed, as more fuses are placed on an integrated circuit and as integrated circuits continue to shrink, the probability of errors in the fuses increases. Thus, what is needed is a mechanism that allows for better failure analysis and testing, yet also allows fuses in their present states to be used by an integrated circuit.

2. Detailed Description

The preferred embodiments of the present invention solve these problems and provide scannable fuse latches that can override current fuse values, read current fuse values, and latch current fuse values. Using the scannable fuse latches of the current invention allows current fuse values to be overridden, which can be important in testing and failure analysis to place the integrated circuit in a known state. The scannable fuse latches of the current invention also allow current fuse values to be read. This aids failure analysis because the current state of the failed integrated circuit can be determined. Finally, the scannable fuse latches of the present invention allow the current state of fuses to be latched and provided to a core of an integrated circuit.

It should be noted that the present invention is also equally applicable to anti-fuses. An anti-fuse works oppositely of a fuse: an anti-fuse makes a contact between two points instead of breaking a contact between two points, as is done with fuses. In the following discussions, anti-fuses may be used by replacing the fuses with anti-fuses. Anti-fuses have the problems associated with fuses, such as having to manually determine whether they create a complete circuit and needing read/write capability. Thus, the present invention is applicable to anti-fuses in addition to fuses. In the present invention, "fuse" will mean anti-fuse or fuse, as each of these either creates a short or an open between two points. A fuse is normally shorted then is blown to become an open, while an anti-fuse is normally open and then a contact is made between the two points to become a short.

Figure 1:
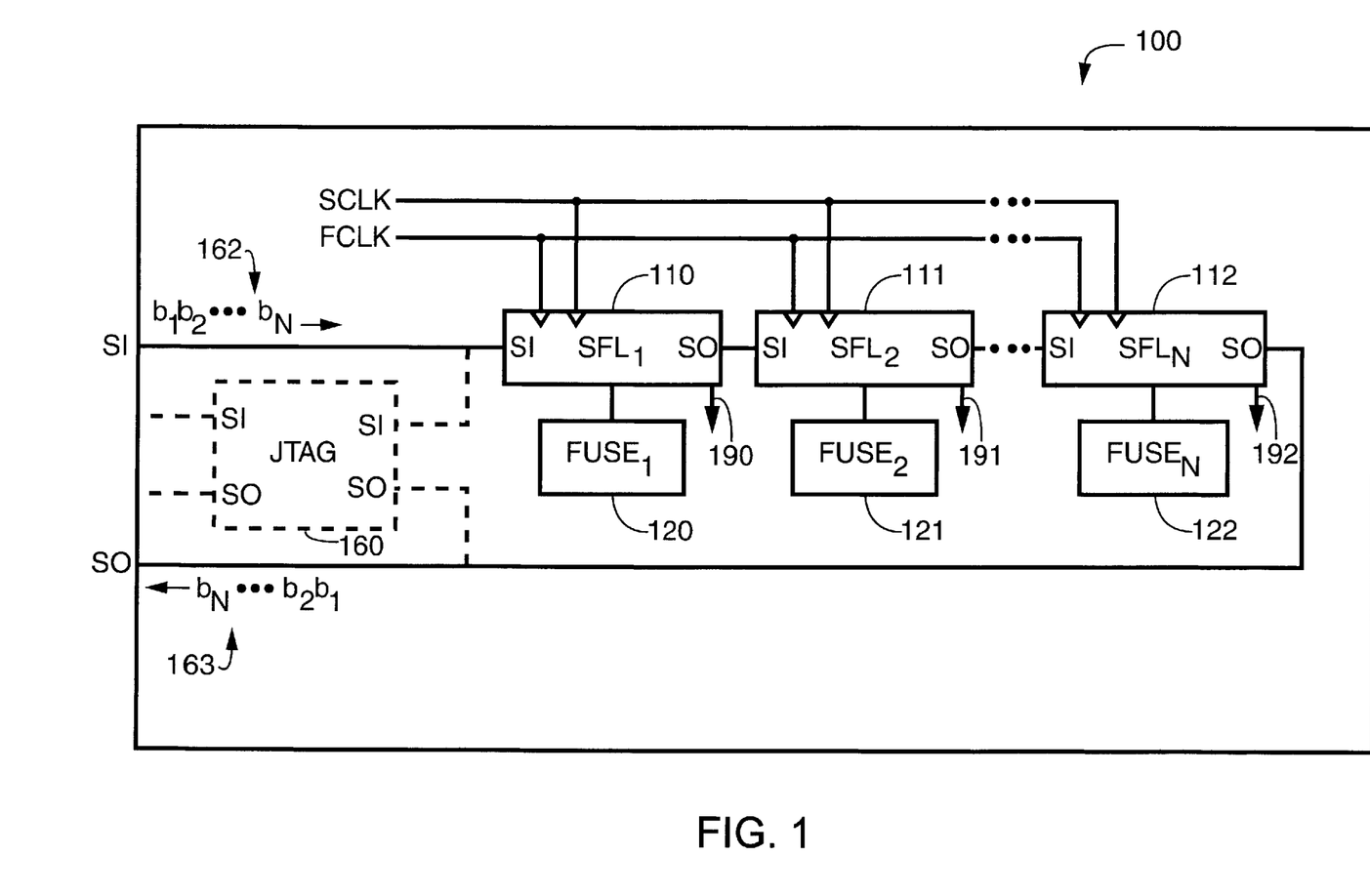
FIG. 1 is an exemplary integrated circuit having a number of scannable fuse latches in accordance with the present invention.

Turning now to FIG. 1, an integrated circuit portion 100 is shown. Integrated circuit portion 100 comprises a number of Scannable Fuse Latches (SFLs) 110, 111, 112. In this example, there are N scannable fuse latches. The integrated circuit portion 100 also comprises a number of core signals 190, 191, 192, clock signals SCLK and FCLK, and optional JTAG controller 160 and its associated SI/SO outputs. Each scannable fuse latch is connected to one fuse 120, 121, 122, respectively, illustrated for clarity in this example as being separate from the scannable fuse latch. Each fuse may be part of a scannable fuse latch or remain separate from the scannable fuse latch. Additionally, some or all of the fuses may be replaced with an anti-fuse. In the example of FIG. 1, a scan-in input (SI) goes off-chip to allow input data access to the scannable fuse latches. Additionally, a scan-out output (SO) goes off-chip to allow output data access to the scannable fuse latches.

Alternatively, a Joint Test Action Group (JTAG) controller 160, into which the SI and SO signals would go, may be used. In this embodiment, the SI and SO signals would not go off-chip, but would instead terminate at the JTAG controller 160. By using private or reserved JTAG instructions, the SI and SO signals from the scannable fuse latches may be made to go off-chip through appropriate JTAG circuitry.

Clock SCLK (scan clock) is used to scan data into and out of the scannable fuse latches 110, 111, 112. Each scannable fuse latch's SI input is connected to the previous scannable fuse latch's SO output, except for the very first scannable fuse latch 110 in the serial chain and the very last scannable fuse latch 112 in the serial chain. Bits 162, b1 through bN, can be scanned in by using an appropriate combination of SCLK and FCLK. Bits 163, b1 through bN, can be scanned out by using an appropriate combination of SCLK and FCLK. When a test engineer desires to read out the states of the fuses 120, 121, 122, the engineer will place a particular sequence of FCLK and SCLK clocks on these clock signals. The bit sequence 163 will then be read out. Preferably, the FCLK clock signal is used to latch the state of each fuse on each scannable fuse latch's SO output. Then, the SCLK clock signal is toggled, causing each scannable fuse latch to read an input on its SI input and to place this input on its SO output. Preferably, N−1 clock cycles are need on SCLK to read out the states of the fuses.

To write different values for the fuses, the same process is performed, except that bit sequence 162 is written into each scannable fuse latch. Each bit of the bit sequence 162 will replace one of the fuse's values. Preferably, it takes N clock cycles on SCLK to write the bit sequence 162.

During normal use of the integrated circuit, the clock signal FCLK is preferably used to latch the state of each fuse. The FCLK is preferably toggled on startup or at reset to latch each fuse's state. This causes the state of the fuse to be latched and output to core signals 190, 191, 192 and to each SO output. During normal operation, FCLK is toggled once after startup and after a reset. Preferably, SCLK is driven high and remains high. Also, after each fuse is latched, each fuse is preferably grounded such that no voltage will be placed across the fuse.

Core signals 190, 191, and 192 are delivered to core circuitry (not shown). Such circuitry could be RAM circuitry that remaps RAM cell addresses, or other circuitry that uses the fuse values. When different overriding values are scanned in, the scannable fuse latch uses the overriding values to override the fuse values and to place the new values onto the core signals 190, 191, and 192.

Figure 7:
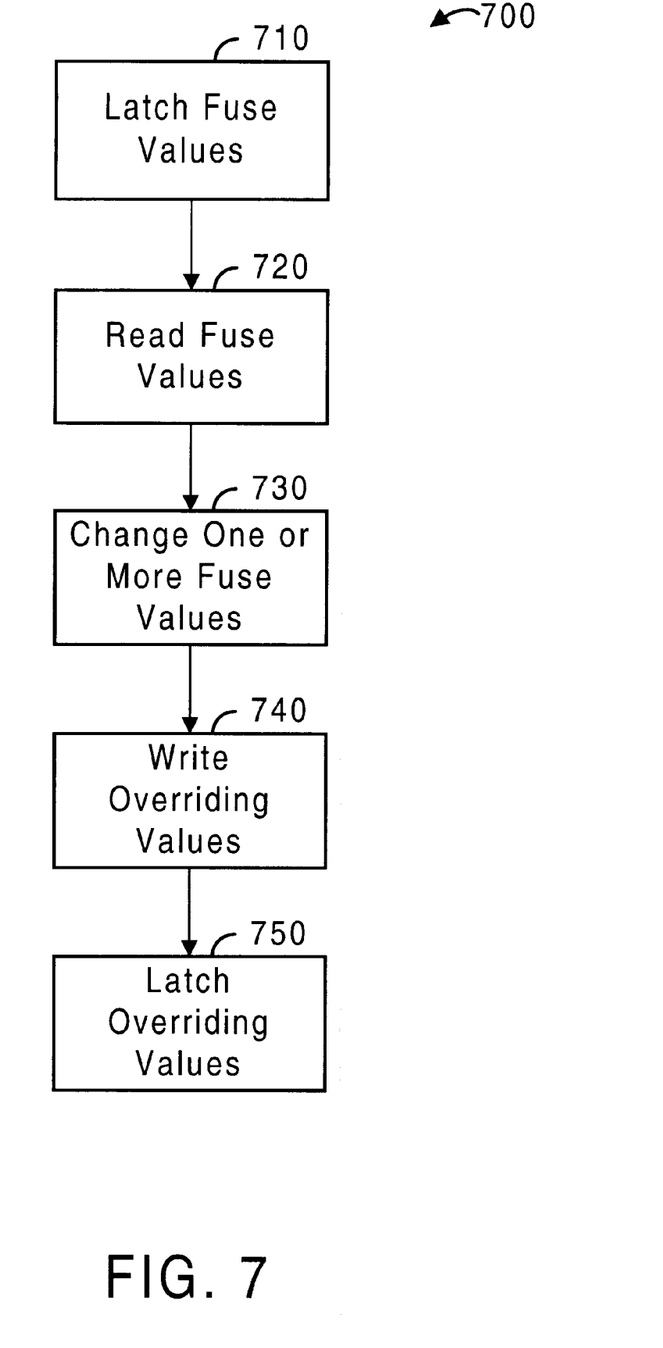
FIG. 7 is a preferred method for using a number of scannable fuse latches in accordance with an embodiment of the present invention.

Turning now to FIG. 7 in addition to FIG. 1, FIG. 7 shows a method 700 that changes the state of fuses when using the current invention. By "fuse" both a fuse and an anti-fuse are meant. Method 700 is used primarily during testing and failure analysis, and it allows the fuse values to be read and written. It should be noted that these steps are not in the order performed, unless an order is necessary. Method 700 begins when the fuse values are latched (step 710). In the most preferred embodiment of the present invention, SCLK is driven high and FCLK is pulsed, high then low. This latches the current state of each fuse onto the SO output of each of the scannable fuse latches 110, 111, 112. Although this is the most preferred mechanism for performing this function, any mechanism that can allow the fuses to be latched may be used.

In step 720, the fuse values are read. In the most preferred embodiment, this is done by cycling SCLK for N−1 cycles of low then high values, as SCLK is preferably active low. The bit sequence 163 is thus serially read out. Parallel operation or some combination of parallel and serial operation is also possible, but serial operation allows less off-chip connections. Each bit in the bit sequence 163 corresponds to the current value of one of the fuses 120, 121, 122. The current value will either be blown or intact, and high or low logic levels will be associated with each current value. For instance, a blown fuse can be a high logic value, while an intact fuse can be a low logic value, or vice versa. The appropriate logic levels will be predetermined.

In step 730, one or more of the fuse values may be changed. This is done by changing particular bits in the bit sequence 163 and then writing the changed sequence of bits as bit sequence 162 into the integrated circuit 100 (step 740). Each bit of the new sequence of bits 162 corresponds to one of the fuses 120, 121, 122, and each bit will replace and override the current fuse values. Toggling SCLK allows the bits to be serially entered into the scannable fuse latches.

In step 750, the new, overriding values are latched. Toggling the SCLK low, in the most preferred embodiment of the present invention, causes SI input values to be read in by the scannable fuse latches 110 through 112. Each scannable fuse latch latches the SI input value internally but the SI value does not yet appear on the SO output. In the most preferred embodiment, toggling the SCLK high causes the SI input values just read in to be latched and placed on the SO output. If there are N scannable fuse latches, SCLK will be toggled N times from low to high. This will read in N values and latch N values. Each low on SCLK reads in and latches a SI input value internally to the scannable fuse latch, and each subsequent high then latches this value to the SO output. Thus, N SCLK clock cycles are used in the most preferred embodiment to latch in N overriding fuse values.

It should be noted that the current state of the fuse does not have to be read out, and that the new bit sequence 162 can be entered directly. However, when there are hundreds or even thousands of fuses on an integrated circuit and only a few fuses need to have their values changed, it becomes very tedious to create a string of bits that is hundreds or thousands of bits long. It is much easier to simply read out the state of the fuses, find the bits corresponding to the fuses that need values changed, change the bits' values, then write the entire string back into the integrated circuit.

A tremendous benefit of method 700 occurs for RAMs. In RAMs, there are generally more RAM bits than are needed for the integrated circuit. Redundancy fuse blocks are used to remap RAM cells that are determined to be bad to good RAM cells. Normally, this is done by testing the RAM, finding the bad cells, remapping RAM cells by blowing fuses in redundancy fuse blocks, and testing the RAM. If the new, remapped RAM cells are also bad, then more remapping must take place. With the current invention, the redundancy fuse blocks can be overridden to point to new RAM cells, and the RAM integrated circuit can be tested. If the remapped RAM cells are also bad, the redundancy fuse blocks can be again overridden and the RAM integrated circuit can be tested. This process can continue until the RAM integrated circuit completes an error-free test. Moreover, if desired, burn-in testing may be performed prior to physically blowing the fuses. Once the proper configuration for fuses is known and tested, the fuses may be blown. Thus, the configuration of the integrated circuit's redundancy fuse blocks may be determined and fully tested without resorting to the destructive and irreversible fuse blowing process.

Moreover, because blowing a fuse is an irreversible step, the present invention has the benefit of allowing the states of all of the fuses to be determined prior to blowing fuses. An additional benefit is directly testing the intact state of the fuses to be sure that the intact state of each fuse is correct before blowing fuses. Previously, one had to test this indirectly by testing the function that the fuses control and inferring the state of the fuse from the functional behavior of the integrated circuit. The present invention allows the intact state of the fuses to be directly tested before the fuses are blown, thereby providing an indication of which, if any, fuses are not intact. Moreover, it is often useful to provide configuration or test circuit control using fuses. This system provides a direct method of controlling these functions during test, without the need to permanently blow fuses.

Figure 2:
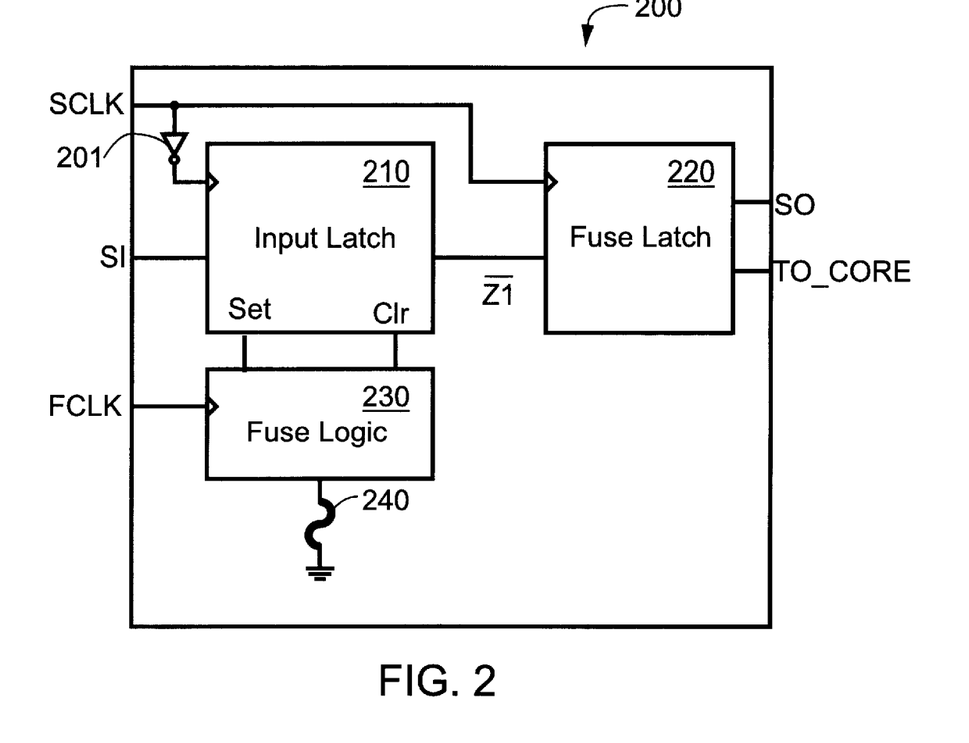
FIG. 2 is a block diagram of a preferred scannable fuse latch.

Referring now to FIG. 2, a preferred scannable fuse latch 200 is shown. In this example, the scannable fuse latch 200 comprises fuse 240, although fuse 240 could be separate from the scannable fuse latch, as shown in FIG. 1. Additionally, fuse 240 could also be an anti-fuse. Scannable fuse latch 200 has clock inputs SCLK and FCLK, scan-in input SI, scan-out output SO, and a TO_CORE output. The TO_CORE output goes to circuitry (not shown) in the integrated circuit that would use the value of the fuse 240. For instance, if fuse 240 was part of a redundancy fuse block, the mapping circuitry would receive the TO_CORE output. Scannable fuse latch 200 comprises an input latch 210, a fuse latch 220, an inverter 201, and fuse logic 230.

The fuse clock (FCLK) acts as an input to fuse logic 230 and the fuse logic 230 will read the value of fuse 240 when the fuse clock is in an appropriate state. When FCLK is enabled, the value of the fuse is read. When FCLK is disabled, the value of the fuse may be overridden through SI and the input latch 210. Preferably, input latch 210 holds the value of fuse 240, determined through the set and clr inputs of the input latch, when the scan clock is active (which is when the clock input to the input latch 210 is inactive due to the inverter 201) and passes this value to the fuse latch 220 through inverted Z1. Inverted Z1 is preferably again inverted in fuse latch 220 and pass through to the scan output (SO). When the scan clock is inactive (which is when the clock input to the input latch 210 is active due to inverter 201), the input latch can load values on the scan-in input. These values are passed to the fuse latch 220 through inverted Z1.

Fuse logic 230 enables the set or clr inputs to the input latch 210, depending on the value of the fuse 240. Preferably, if the fuse 240 is blown, the set input will be enabled; if the fuse is intact, the clr input will be enabled. Also preferably, when the fuse clock is disabled, the fuse logic 230 would disable the fuse logic inputs set and clr. This allows the input latch 210 to more easily override these values. Additionally, the fuse logic 230 preferably places the fuse in a grounded state during normal operation.

Fuse latch 220 loads the value of inverted Z1 when the scan clock is enabled and holds the value of the inverted Z1 when the scan clock is disabled. Preferably, the fuse latch inverts the value of inverted Z1 and places this inverted value on the scan-out output.

During normal operation, both the fuse clock and the scan clock will be driven high soon after reset, initialization, or on power-up. With the fuse clock enabled, the fuse logic 230 loads the value of fuse 240 and acts to enable the set or clr inputs to the input latch. When the scan clock (SCLK) is enabled, the input latch acts to pass the set or clr information, as an input value, to the fuse latch 220 through the inverted Z1, and the fuse latch 220 loads the value of inverted Z1 and places this in the scan-out output. After a predetermined time, the fuse clock is driven inactive and the fuse logic 230 then disables the set/clr information while also grounding the fuse 240.

During a scan mode, such as during testing or failure analysis, the scan clock will be toggled inactive then active, while holding the fuse clock inactive. When SCLK is low, the input latch 210 reads the scan-in input and uses this value to drive inverted Z1. The fuse latch 220 will hold the value of the previous Z1. Initially, this will be the fuse value. When SCLK is high, the input latch 210 holds the value of inverted Z1 (which is now the scan-in input) and the fuse latch 220 loads this value. Thus, by toggling the scan clock, information can be scanned through the scannable fuse latch 200.

Figure 3:
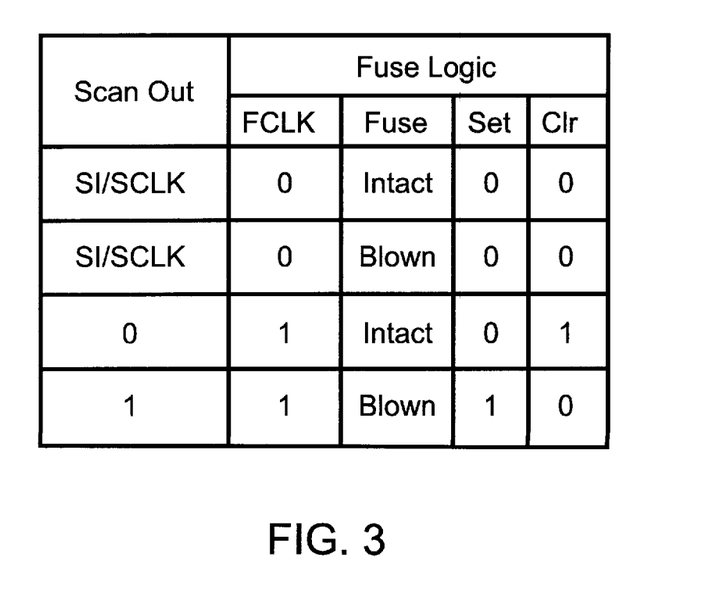
FIG. 3 is a preferred truth table for a preferred scannable fuse latch of the present invention.

A preferred truth table of the most preferred embodiment of the present invention is illustrated in FIG. 3. Referring to FIG. 3 in addition to FIG. 2, the output scan-out (SO) is shown along with possible inputs to and outputs from the fuse logic. When FCLK is enabled, the value of the fuse is read and the set or clr is output by the fuse logic 230. When the fuse is intact, the clr input to the input latch 210 will be enabled and the scan-out and TO_CORE outputs will be a logic low level. When the fuse is blown, the set input to he input latch 210 will be enabled and the scan-out output and TO_CORE output will be a logic high level. As is known in the art, the set, clr, FCLK, SCLK, SI and SO values may be opposite from those shown in FIG. 3, if desired.

When the FCLK is inactive, the set and clr are forced inactive and the outputs (scan-out and TO_CORE) are controlled by the scan-in input and the scan clock (SCLK). When the scan clock is disabled, the input latch 210 will load the value of the scan-in input (SI) and will hold this value when the scan clock is enabled. On the other hand, the fuse latch 220 loads the value of inverted Z1 when the scan clock is enabled and will hold the value of inverted Z1 when the scan clock is disabled.

Figure 4:
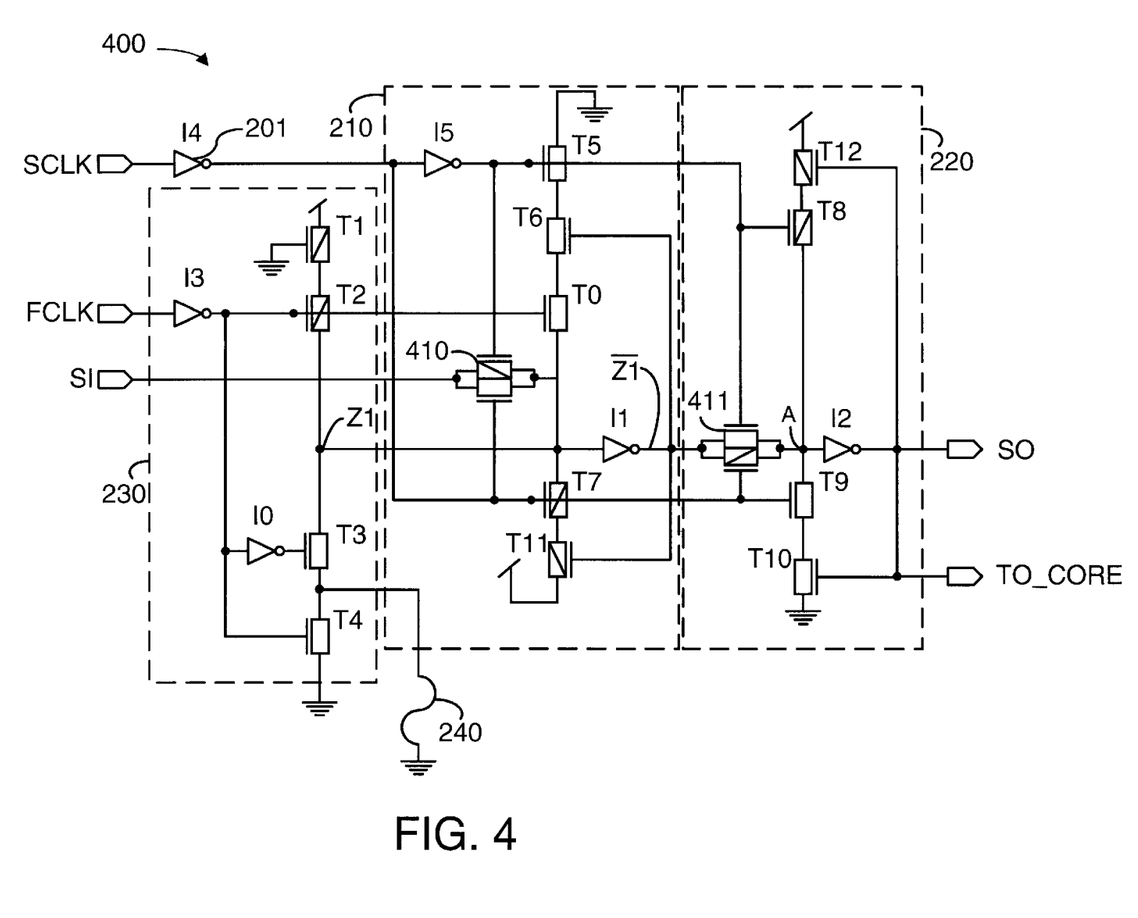
FIG. 4 is a circuit diagram of the most preferred scannable fuse latch of the present invention.

Referring now to FIG. 4, the most preferred scannable fuse latch of the present invention is shown. Scannable fuse latch 400 comprises thirteen transistors, numbered T0 through T12, six inverters, numbered I0 through I5, two pass drivers 410, 411, and fuse 240. It should be noted that fuse 240 may also be an anti-fuse. In this example, fuse 240 is shown as part of scannable fuse latch 400, but fuse 240 may also be separate from scannable fuse latch 400. Each pass driver 410, 411 preferably comprises a P-channel transistor in parallel with an N-channel transistor. This creates a driver that is either "off" or "on". Each transistor in the following discussion has a control input and source/drain connections.

When FCLK is driven to a high logic level, inverter I3 inverts this signal to a low logic level. This causes transistor T2 to become active and inactivates transistor T4. The inverter I0 inverts the low logic level to a high logic level, which activates transistor T3. If the fuse is intact, it acts like a short, which connects one of the source/drain regions of transistor T3 to ground. This forces node Z1 to ground, and inverter I1 inverts this low logic level to a high logic level and drives inverted Z1 to a high logic level. If the fuse is blown, it acts like an infinite resistance, which causes node Z1 to be pulled high through transistors T1 and T2.

When FCLK is driven to a low logic level, inverter I3 inverts the logic low level to a high logic level, thereby inactivating transistor T2 and activating transistor T4. Inverter I0 inverts the high logic level to a low logic level, thereby inactivating transistor T3. Node Z1 is left unchanged.

In this example, the set and clr functionality of FIG. 2 is shared by node Z1 and the FCLK control input to transistor T0. Node Z1 determines the logic level of set or clr and the FCLK control input to transistor T0 actually latches the set or clear value. When FCLK is driven to a low logic level, transistor T0 is turned on or activated. When SCLK is a high logic level, inverter I4 inverts this to a low logic level, which turns on transistor T7. Additionally, inverter I5 inverts the low logic level to a high logic level, which turns on transistor T5. Transistors T6 and T11 are now controlled by the logic level on inverted Z1. If inverted Z1 is high (meaning that Z1 is low or the fuse 240 is intact), transistor T6 will be turned on and transistor T11 will be off. Node Z1 is pulled low through transistors T0, T6, and T5. If inverted Z1 is low (meaning that Z1 is high or the fuse 240 is blown), transistor T11 is off while transistor T6 is on. Node Z1 is pulled high through transistors T7 and T11. Thus, the value of node Z1 is maintained and latched when SLCK is high.

When SCLK is high, pass driver 411 is on and pass driver 410 is off. Additionally, transistors T8 and T9 are off. The logic level of the SO output will have an effect on transistors T12 and T10. However, because transistors T8 and T9 are off, the node A's voltage level will not be affected by transistors T12 and T10.

When SCLK is driven low, transistor T5 is turned off, as is transistor T7. Pass driver 410 is turned on, allowing the scan-in input (SI) to be connected to node Z1. If FCLK is low, transistors T2 and T3 will be off, allowing Z1 to be driven by SI to the logic level of SI. Pass driver 411 is also off, meaning that the scan-in input is loaded into Z1 (and inverted for inverted Z1), but is not latched into the fuse latch 220. Transistors T8 and T9 are on. If the scan-out output (SO) is high, node A will be driven low through transistors T9 and T10, thereby latching this high SO. On the other hand, if the scan-out output is low, node A will be driven high through transistors T12 and T8, thereby latching this low SO.

During normal operation, after reset or upon initialization, FCLK and SCLK will be driven high. This loads the value of the fuse onto node Z1, through pass driver 411, and to SO and TO_CORE. The FCLK is then driven low, and the value of Z1 is latched through transistors T0, T6, T5, T7, and T11. Additionally, the fuse 240 is grounded through transistor T4.

To scan data in and out of the scannable fuse latch 400, the scan clock can be toggled low then high while the fuse clock is low. A low SCLK reads the value on SI and causes node Z1 to be the same value as SI. When the scan clock transitions high, the pass driver 410 turns off and the pass driver 411 turns on, loading value of inverted Z1 into node A. The value at node A is inverted by inverter I2 and transmitted to SO and TO_CORE. With each low of SCLK, a new SI value may be input to the input latch 210 and with each high SCLK this new SI value can be loaded into the fuse latch 220 and driven onto SO and TO_CORE.

Thus, FIGS. 1 through 4 and 7 illustrate scannable fuse latches that can override current fuse values, read current fuse values, and latch current fuse values. Using the scannable fuse latches of the current invention allows current fuse values to be overridden, which can be important in testing and failure analysis to place the integrated circuit in a known state. The scannable fuse latches of the current invention also allow current fuse values to be read. This aids failure analysis because the current state of the failed integrated circuit can be determined. Finally, the scannable fuse latches of the present invention allow the current state of fuses to be latched and provided to a core of an integrated circuit.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the forthcoming claims. It should be noted that any method claims are not necessarily in the order recited, unless an order is necessary.

What is claimed is:

1. A scannable fuse latch comprising:
    a scan-in input;
    a scan-out output;
    fuse logic connected between a fuse and an input latch, the fuse logic comprising a first state where a value of the fuse is read and output to the input latch;
    an input latch connected between the scan-in input and a fuse latch, the input latch comprising a first state wherein the input latch reads the value of the fuse as an input value and outputs this input value to the fuse latch, and comprising a second state wherein the input latch reads a value of the scan-in input as an input value and outputs the input value to the fuse latch; and
    the fuse latch connected between the input latch and the scan-out output, the fuse latch comprising a first state wherein the fuse latch latches the input value and outputs the input value to the scan-out output.

2. The scannable fuse latch of claim 1 wherein the fuse logic is coupled to the input latch through at least one fuse logic output, wherein the fuse logic comprises a second state wherein the fuse logic grounds the fuse and disables the fuse logic output, and wherein fuse logic in its first state outputs the value of the fuse through the at least one fuse logic output.

3. The scannable fuse latch of claim 2 wherein the fuse logic is coupled to a fuse clock, and wherein the fuse logic enters the first state when the fuse clock is active and enters the second state when the fuse clock is inactive.

4. The scannable fuse latch of claim 3 wherein the input latch comprises a third state wherein the input latch latches the input value.

5. The scannable fuse latch of claim 4 wherein the input latch is coupled to an inverted scan clock and wherein the input latch reads the input value when the inverted scan clock is active and latches the input value when the inverted scan clock is inactive.

6. The scannable fuse latch of claim 1 wherein the fuse latch comprises a second state wherein the fuse latch reads the input value.

7. The scannable fuse latch of claim 6 wherein the fuse latch is coupled to a scan clock and wherein the fuse latch reads the input value when the scan clock is active and latches the input value when the scan clock is inactive.

8. The scannable fuse latch of claim 1 wherein the fuse logic is coupled to the input latch through a set input and a clr input, and wherein the value of the fuse is output to the input latch by activating either the set or the clr input.

9. The scannable fuse latch of claim 8 wherein the fuse logic activates the set input if the fuse is blown and activates the clr input if the fuse is intact.

10. The scannable fuse latch of claim 1 wherein the fuse is an anti-fuse.

11. An integrated circuit comprising:
    a scan clock;
    a fuse clock;
    a plurality of fuses;
    a plurality of serially connected scannable fuse latches, each scannable fuse latch coupled to the scan clock, the fuse clock, and one of the fuses, each scannable fuse latch comprising:
        a scan-in input;
        a scan-out output;
        fuse logic connected between the one fuse and an input latch, the fuse logic coupled to the input latch through at least one fuse logic input and coupled to the fuse clock, wherein the fuse logic reads a value of the one fuse when the fuse clock is active and outputs the fuse value to the input latch through the at least one fuse logic input;

an input latch connected between the scan-in input and a fuse latch, the input latch coupled to a scan clock, wherein the input latch reads the value of the one fuse as an input value and outputs this input value to the fuse latch when the scan clock is inactive, wherein the input latch reads a value of the scan-in input as an input value and outputs the input value to the fuse latch when the scan clock is active; and the fuse latch connected between the input latch and the scan-out output, the fuse latch coupled to the scan clock, wherein the fuse latch latches the input value and outputs the input value to the scan-out output when the scan clock is inactive.

12. The integrated circuit of claim 11 wherein each of the plurality of fuses is an anti-fuse.

13. The integrated circuit of claim 11 wherein the fuse logic disables the at least one fuse logic input and grounds the fuse when the fuse clock is inactive.

14. The integrated circuit of claim 11 wherein the fuse latch reads the input value when the scan clock is active.

15. A method for changing the state of a plurality of fuses on an integrated circuit, the method comprising the steps of:

latching a plurality of current fuse values, each current fuse value corresponding to one of the plurality of fuses;

reading the plurality of current fuse values to create a plurality of read fuse values;

changing at least one of the plurality of read fuse values to create a plurality of overriding values;

writing the plurality of overriding values to the plurality of fuses, one overriding value for each fuse; and latching each of the plurality of overriding values, thereby overriding each of the current fuse values.

16. The method of claim 15 further comprising the steps of:

providing a plurality of scannable fuse latches, each of the scannable fuse latches coupled to one of the fuses and comprising a scan-in input and a scan-out output;

serially connecting the plurality of scannable fuse latches into a series by connecting the scan-out output of one of the scannable fuse latches with a scan-in input of another of the scannable fuse latches and continuing this process until each of the scannable fuse latches is coupled to another of the scannable fuse latches;

coupling the scan-in input of a first scannable fuse latch in the series to an input; and coupling the scan-out output of a last scannable fuse latch in the series to an output.

17. The method of claim 16 wherein the step of reading the plurality of current fuse values to create a plurality of read fuse values comprises the step of serially reading each of the plurality of fuse values from each of the scannable fuse latches, and wherein the step of writing the plurality of overriding values to the plurality of fuses comprises the step of serially writing each of the plurality of overriding values to each of the scannable fuse latches.

18. The method of claim 17 wherein:

the method further comprises the steps of:

providing a scan clock that is coupled to each of the scannable fuse latches; and providing a fuse clock that is coupled to each of the scannable fuse latches;

the step of serially reading each of the plurality of fuse values from each of the scannable fuse latches comprising the steps of:

inactivating the fuse clock;

toggling the scan clock inactive, thereby causing each scannable fuse latch to read its respective scan-in input; and toggling the scan clock active, thereby causing each scannable fuse latch to latch the scan-in input and couple the scan-in input onto the scanout output; and the step of serially reading each of the plurality of fuse values from each of the scannable fuse latches comprising the steps of:

inactivating the fuse clock;

toggling the scan clock inactive, thereby causing each scannable fuse latch to read its respective scan-in input; and toggling the scan clock active, thereby causing each scannable fuse latch to latch the scan-in input and couple the scan-in input onto the scanout output.

19. The method of claim 15 wherein the step of latching a plurality of current fuse values further comprises the step of shorting each of the fuses after the plurality of current fuse values have been latched.

* * * * *